United States Patent
Suwa et al.

(10) Patent No.: US 8,034,695 B2
(45) Date of Patent: Oct. 11, 2011

(54) SEMICONDUCTOR DEVICE AND METHOD OF MANUFACTURING THE SAME

(75) Inventors: Yoshito Suwa, Kanagawa-ken (JP); Masataka Takebuchi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 634 days.

(21) Appl. No.: 12/107,444

(22) Filed: Apr. 22, 2008

(65) Prior Publication Data

US 2008/0265328 A1    Oct. 30, 2008

(30) Foreign Application Priority Data

Apr. 25, 2007  (JP) .................. 2007-115473

(51) Int. Cl.
*H01L 21/00* (2006.01)
(52) U.S. Cl. .................. 438/480; 438/289; 438/258
(58) Field of Classification Search .......... 438/480, 438/289, 258
See application file for complete search history.

(56) References Cited

U.S. PATENT DOCUMENTS

| | | | | |
|---|---|---|---|---|
| 4,471,373 A * | 9/1984 | Shimizu et al. | ............... | 257/315 |
| 4,651,406 A * | 3/1987 | Shimizu et al. | ............... | 438/275 |
| 5,861,347 A * | 1/1999 | Maiti et al. | ............... | 438/787 |
| 6,043,128 A * | 3/2000 | Kamiya | ............... | 438/289 |
| 6,184,094 B1 * | 2/2001 | Goto | ............... | 438/276 |
| 6,258,673 B1 * | 7/2001 | Houlihan et al. | ............... | 438/275 |
| 6,376,879 B2 * | 4/2002 | Mori et al. | ............... | 257/347 |
| 6,492,690 B2 * | 12/2002 | Ueno et al. | ............... | 257/392 |
| 6,503,800 B2 * | 1/2003 | Toda et al. | ............... | 438/279 |
| 6,551,884 B2 * | 4/2003 | Masuoka | ............... | 438/275 |
| 6,613,659 B2 * | 9/2003 | Kikuchi et al. | ............... | 438/591 |
| 6,803,278 B2 * | 10/2004 | Tran | ............... | 438/258 |
| 6,900,086 B2 * | 5/2005 | Mori et al. | ............... | 438/201 |
| 6,953,727 B2 * | 10/2005 | Hori | ............... | 438/275 |
| 7,084,035 B2 * | 8/2006 | Ueda | ............... | 438/275 |
| 7,126,172 B2 * | 10/2006 | Lim et al. | ............... | 257/275 |
| 7,172,942 B2 * | 2/2007 | Kishiro | ............... | 438/287 |
| 7,205,630 B2 * | 4/2007 | Chang et al. | ............... | 257/500 |
| 7,253,114 B2 | 8/2007 | Chen et al. | | |
| 2002/0000617 A1 * | 1/2002 | Mori et al. | ............... | 257/368 |
| 2002/0098652 A1 * | 7/2002 | Mori et al. | ............... | 438/258 |
| 2003/0203605 A1 * | 10/2003 | Mori et al. | ............... | 438/586 |
| 2006/0079047 A1 * | 4/2006 | Lim et al. | ............... | 438/199 |
| 2008/0175053 A1 * | 7/2008 | Lue et al. | ............... | 365/185.05 |
| 2008/0265328 A1 * | 10/2008 | Suwa et al. | ............... | 257/365 |

FOREIGN PATENT DOCUMENTS

JP    2001-015505    1/2001

(Continued)

*Primary Examiner* — Laura M Menz
(74) *Attorney, Agent, or Firm* — Turocy & Watson, LLP

(57) ABSTRACT

A method of manufacturing a semiconductor device comprising the steps of: forming a first silicon oxide film which covers a first region on the top surface of a silicon substrate, but which does not cover a second region and a third region thereon; oxidizing the silicon substrate to thicken the first silicon oxide film formed on the first region, and to form a second silicon oxide film on the second region and the third region; forming a first silicon film which covers the first region and the second region, but which does not cover the third region; etching and removing the second silicon oxide film formed on the third region by using the first silicon film as a mask; and forming a third silicon oxide film on the third region, the third silicon oxide film being thinner than the second silicon oxide film.

13 Claims, 8 Drawing Sheets

FOREIGN PATENT DOCUMENTS

| | | | |
|---|---|---|---|
| JP | 2001015505 A * | 1/2001 | |
| JP | 2002-110812 | 4/2002 | |
| JP | 2002-343879 | 11/2002 | |
| JP | 2003-060074 | 2/2003 | |
| JP | 2005-303037 | 10/2005 | |
| JP | 2006019515 A * | 1/2006 | |

* cited by examiner

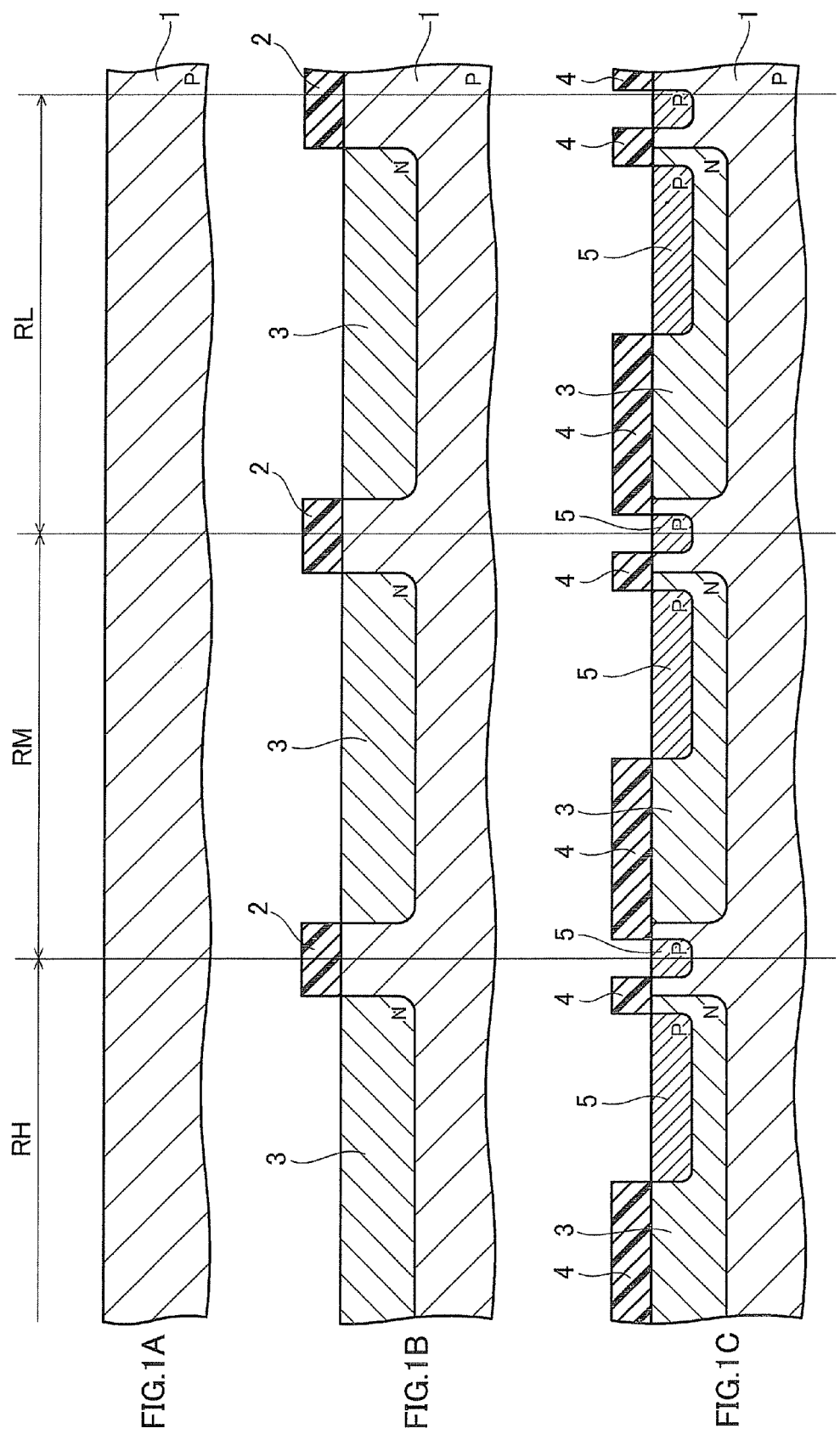

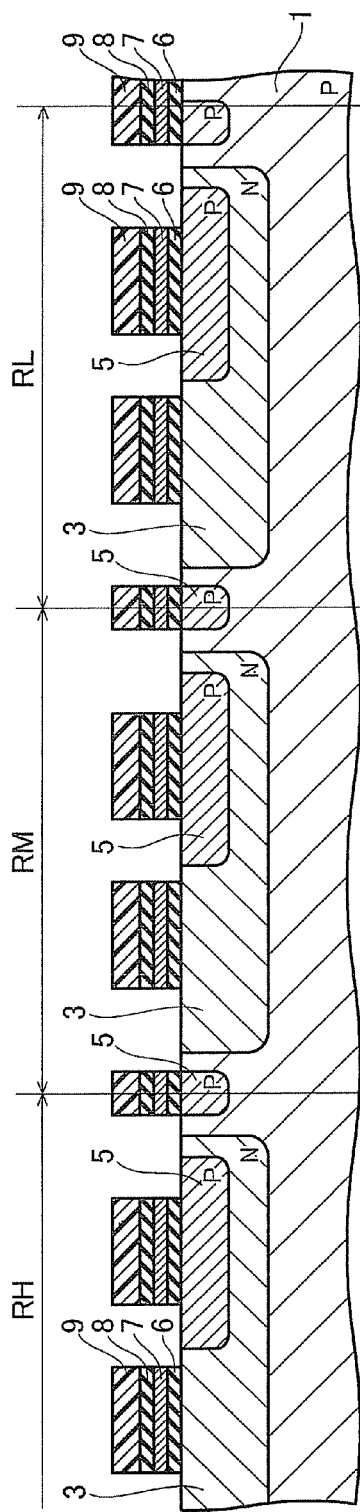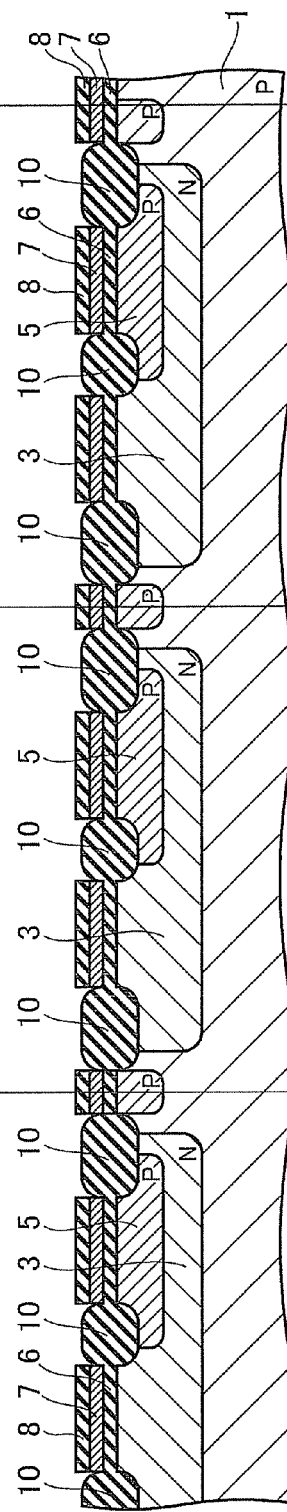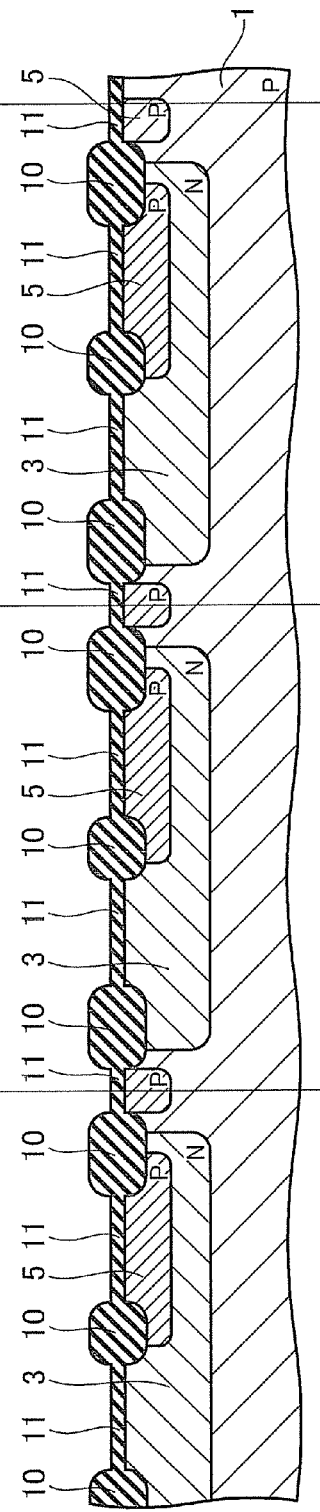
FIG.2A
FIG.2B
FIG.2C

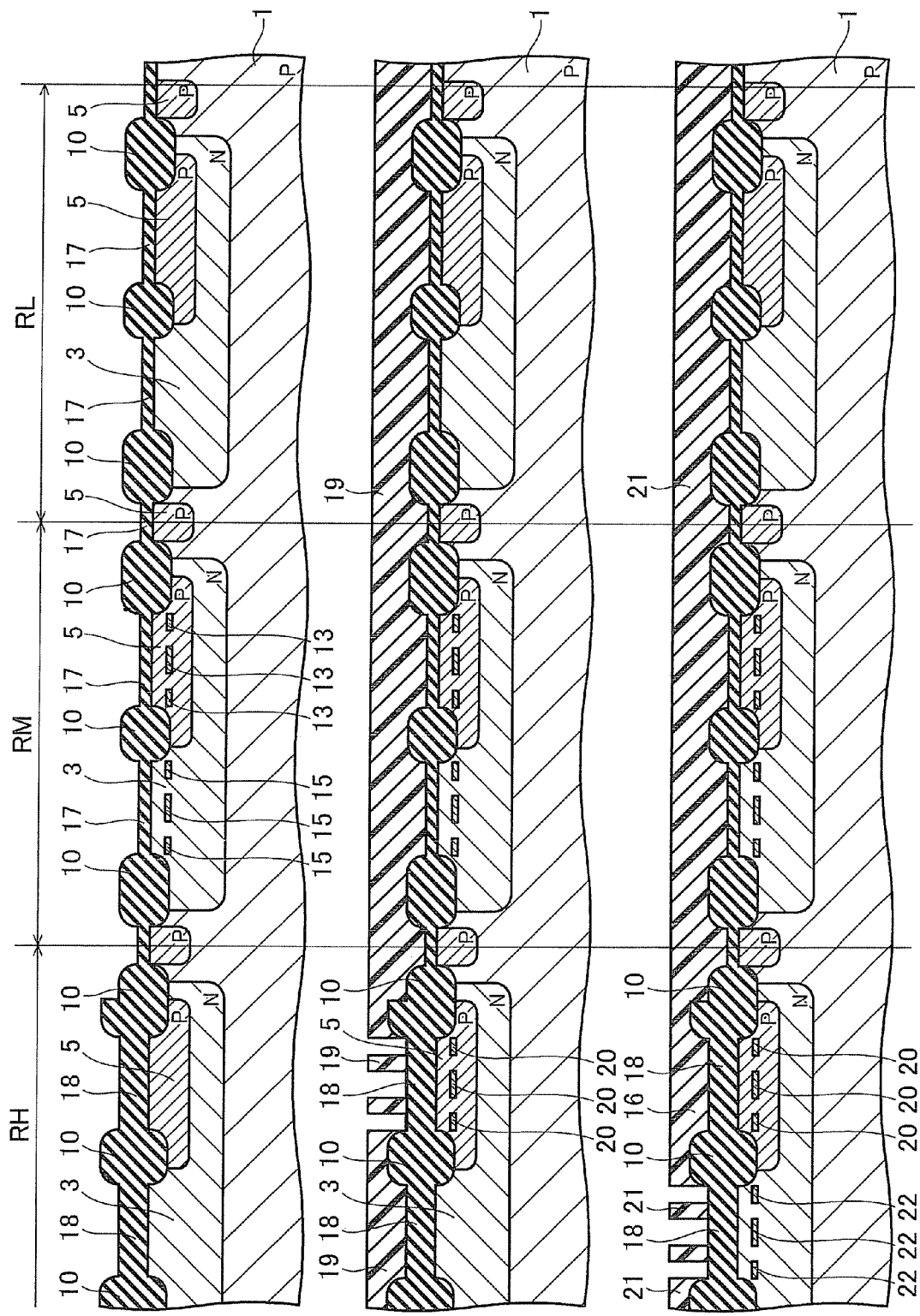

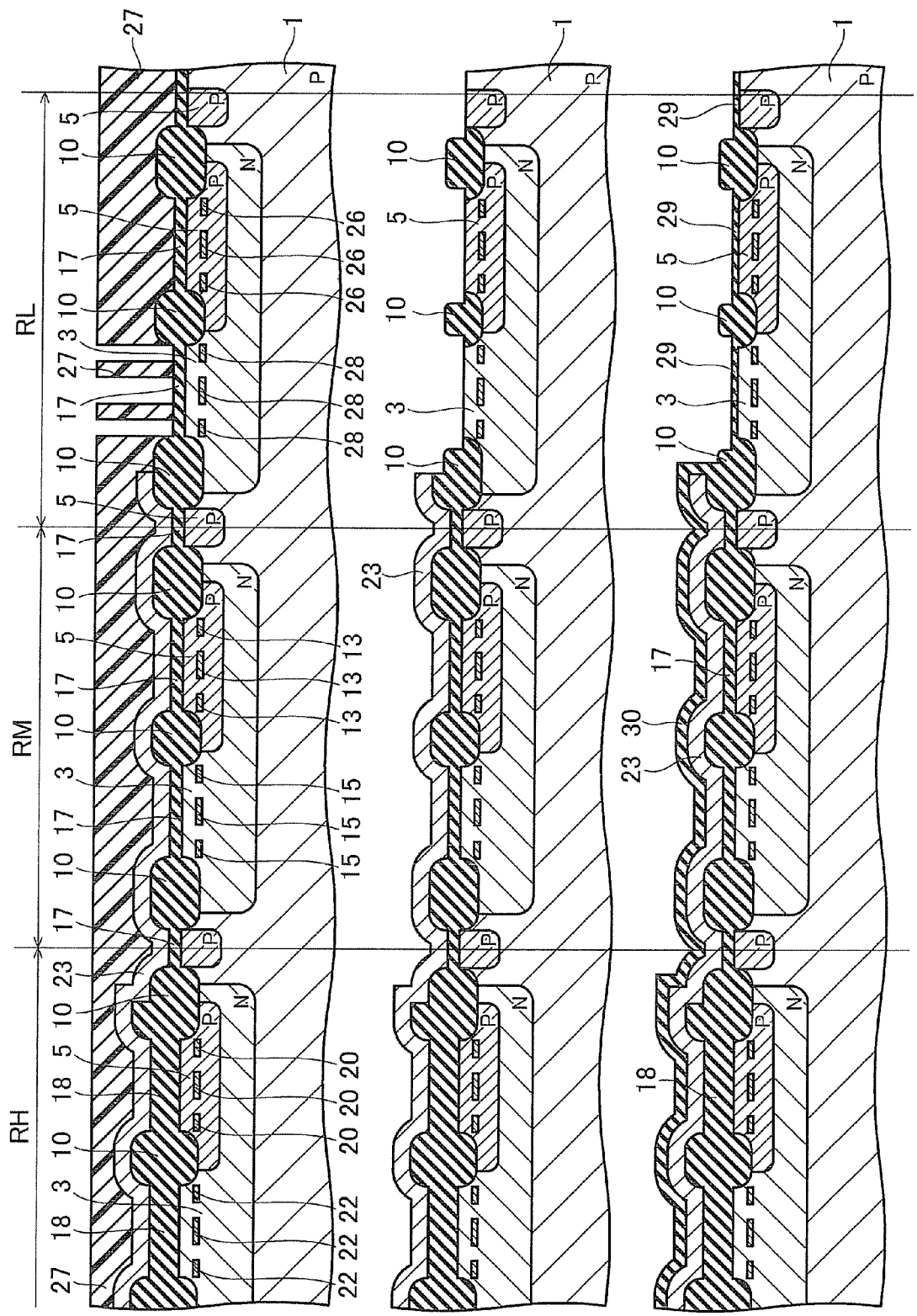

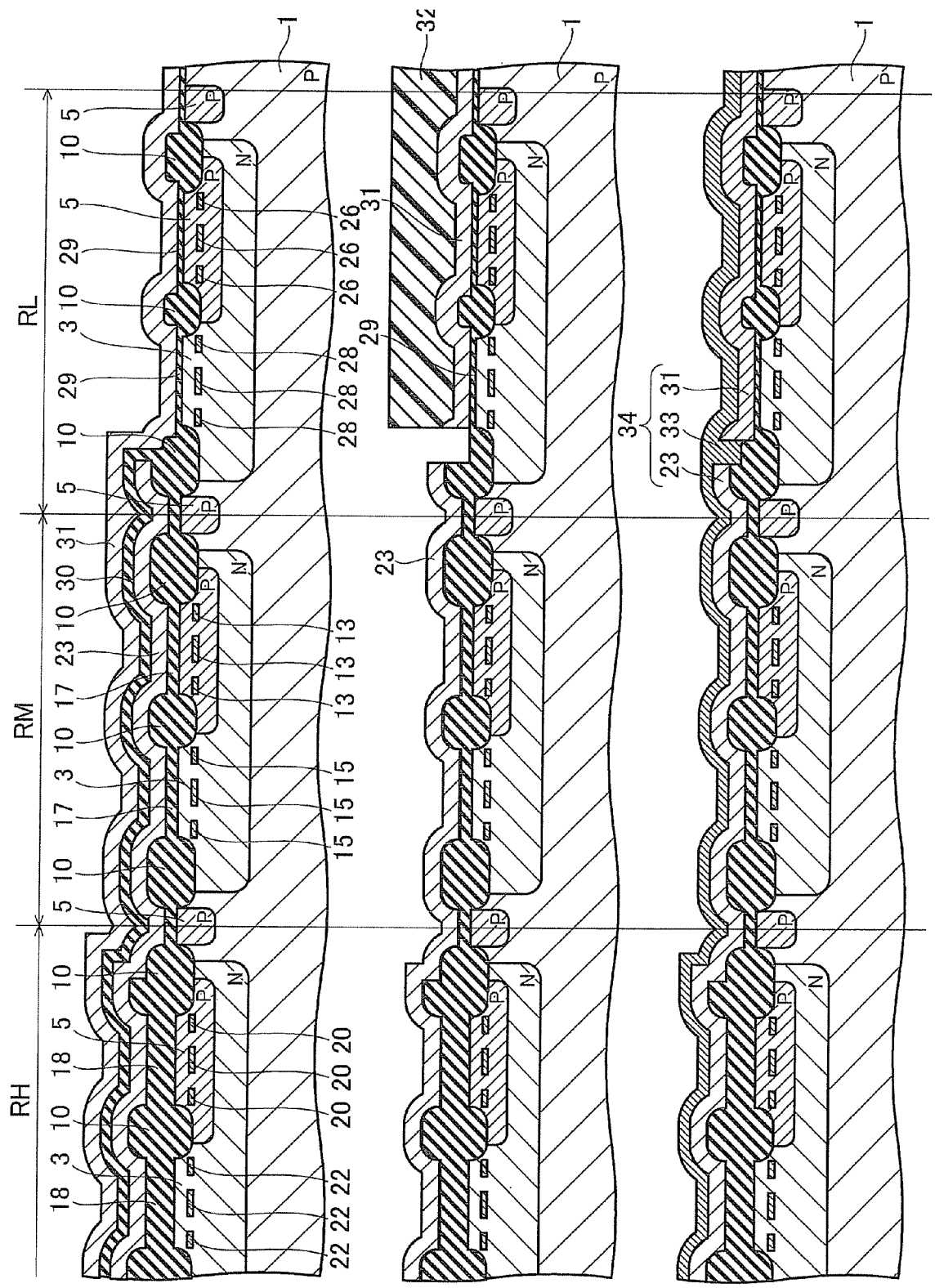

US 8,034,695 B2

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2007-115473, filed on Apr. 25, 2007; the entire contents of which are incorporated herein by reference.

BACKGROUND OF THE INVENTION

The present invention relates to a semiconductor device and a method of manufacturing the same. Specifically, the present invention relates to a semiconductor device in which gate insulating films with three different levels of thicknesses are formed, and a manufacturing method for the same. Specifically, the present invention relates to a semiconductor device having gate insulating films with three levels of thicknesses formed therein, and a method of manufacturing the same.

Recently, developed is a semiconductor device of a multi-functional consolidated type formed on one chip. In order to make use of multiple levels of control voltages in such a semiconductor device, it is desirable that gate insulating films of MOSFET (Metal Oxide Semiconductor Field Effect Transistor) be also formed to have multiple levels of thicknesses.

For example, Japanese Patent Application Publication No. 2003-60074 discloses a technique to form gate insulating films having three different thicknesses in one chip. However, this conventional technique has the following problems. Specifically, because a silicon nitride film is used as a mask in the formation of these gate insulating films, it is hard to control a selective etching ratio between the silicon nitride film as the mask and a silicon oxide film serving as the gate insulating film. Accordingly, the shape of the gate insulating film is controlled to a lesser extent. Furthermore, the need to remove the silicon nitride film having been formed and used as the mask leads to an increase in the number of manufacturing steps.

SUMMARY OF THE INVENTION

According to an aspect of the invention, there is provided a method of manufacturing a semiconductor device comprising the steps of: forming a first silicon oxide film which covers a first region on the top surface of a silicon substrate, but which does not cover a second region and a third region thereon; oxidizing the silicon substrate to thicken the first silicon oxide film formed on the first region, and to form a second silicon oxide film on the second region and the third region; forming a first silicon film which covers the first region and the second region, but which does not cover the third region; etching and removing the second silicon oxide film formed on the third region by using the first silicon film as a mask; and forming a third silicon oxide film on the third region, the third silicon oxide film being thinner than the second silicon oxide film.

According to another aspect of the invention, there is provided a semiconductor device comprising: a first silicon oxide film which is formed to cover a first region on the top surface of a silicon substrate, but not to cover a second region and a third region thereon; a second silicon oxide film which is formed to thicken the first silicon oxide film, and to cover the second region; a first gate electrode and a second gate electrode which are made of a first silicon film used as an etching mask for the formation of the second silicon oxide film, and which are formed respectively on the first and second regions; a third silicon oxide film which is formed to cover the third region, and which is thinner than the second silicon oxide film; a third gate electrode which is made of a second silicon film used as an etching mask for the formation of the third silicon oxide film, and which is formed on the third region.

BRIEF DESCRIPTION OF THE DRAWINGS

FIGS. 1A to 1C are process cross-sectional views for exemplifying a method of manufacturing a semiconductor device according to an embodiment of the present invention.

FIGS. 2A to 2C are process cross-sectional views for exemplifying the method of manufacturing a semiconductor device according to this embodiment.

FIGS. 4A to 4C are process cross-sectional views for exemplifying the method of manufacturing a semiconductor device according to this embodiment.

FIGS. 6A to 6C are process cross-sectional views for exemplifying the method of manufacturing a semiconductor device according to this embodiment.

FIGS. 7A to 7C are process cross-sectional views for exemplifying the method of manufacturing a semiconductor device according to this embodiment.

DETAILED DESCRIPTION OF THE INVENTION

Figures 3A, 3B, 3C:
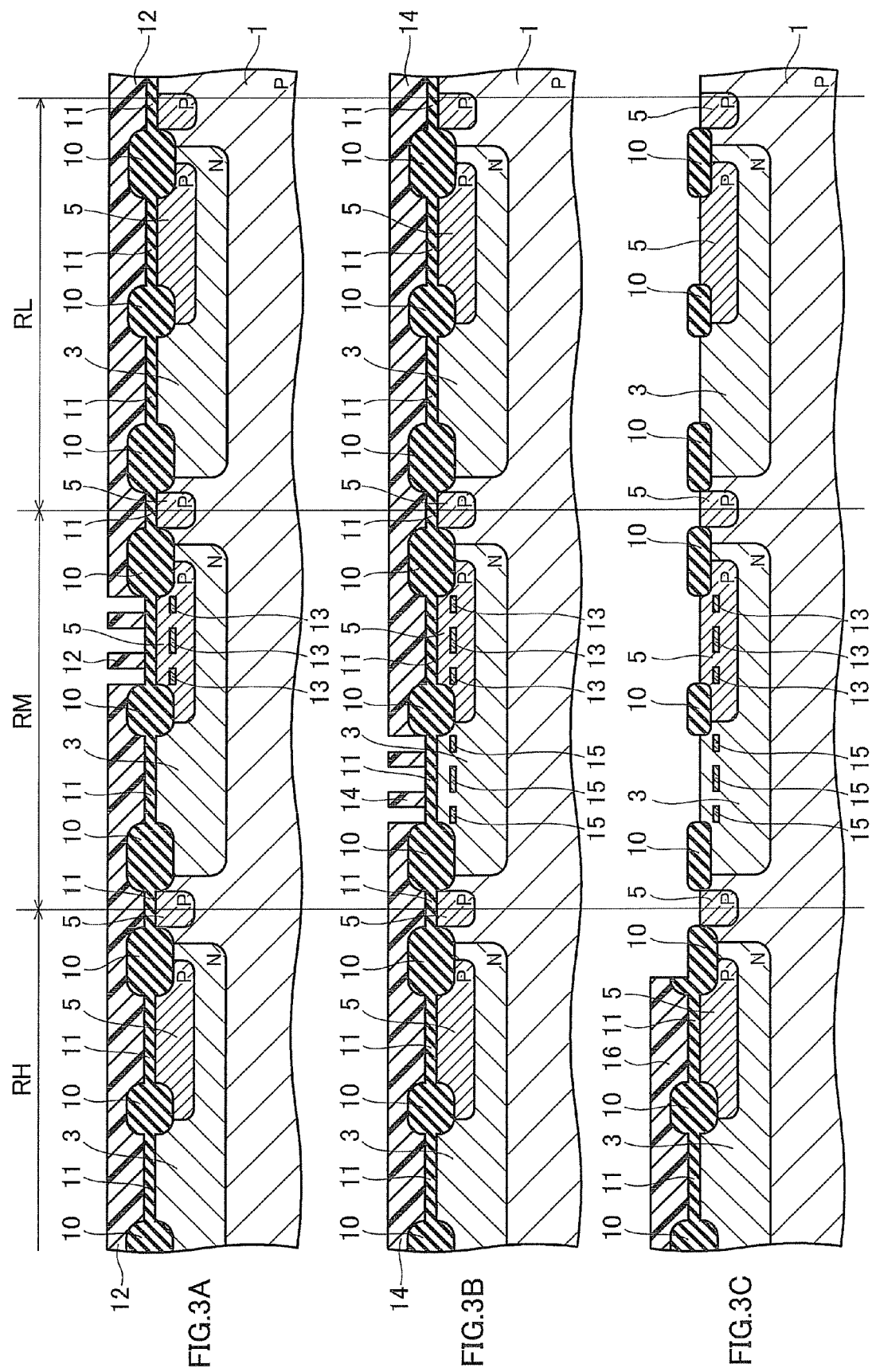
FIGS. 3A to 3C are process cross-sectional views for exemplifying the method of manufacturing a semiconductor device according to this embodiment.

Hereinafter, an embodiment of the present invention will be described with reference to the drawings.

This embodiment is a method of manufacturing a semiconductor device having gate insulating films with three levels of thicknesses.

FIG. 1A to FIG. 8C are process cross-sectional views for exemplifying the method of manufacturing a semiconductor device according to this embodiment.

Firstly, as shown in FIG. 1A, prepared is a P type silicon substrate 1 which is made of a single crystal silicon wafer. Regions RH, RM and RL are formed on the top surface of the silicon substrate 1. The region RH will be provided with an element having an intermediate breakdown voltage, for example, a MOSFET with a gate voltage in a range of approximately 5 V (volt) to 18 V. The region RM will be provided with a MOSFET with a gate voltage of approximately 5 V. The region RL will be provided with a MOSFET with a gate voltage of approximately 3 V.

Next, the silicon substrate 1 is subjected to a generally-used photolithography method. Specifically, in the method, the top surface of the silicon substrate 1 is coated with a resist film, and this resist film is exposed to light through a mask (unillustrated) for the development, and the resist film is selectively removed. Thereby, a resist pattern 2 is formed as shown in FIG. 1B. Then, ions of phosphorus (P) are implanted with a relatively high accelerating voltage, while the resist pattern 2 is used as a mask to form wells 3 with a conductivity type of N into relatively deep regions of the respective regions RH, RM and RL. Thereafter, the resist pattern 2 is removed.

Note that, at this point, in order to suppress the damage occurred in the silicon substrate 1 due to the ion implantation, and to prevent the implanted phosphorus from evaporating, a sacrificial oxide film (unillustrated) is formed on the top surface of the silicon substrate 1, and removed after the ion implantation. Likewise, in later ion-implantation steps, a sacrificial oxide film may be formed and then removed. However, the description and illustration are omitted. Additionally, in a case where a resist pattern is formed in later steps, the resist pattern is formed by a generally-used photolithography method as in the case of the resist pattern 2 described above.

Next, as shown in FIG. 1C, a resist pattern 4 is formed on the silicon substrate 1. Ions of boron (B) are implanted, while the resist pattern 4 is used as a mask. Then, P wells 5 are formed in and between the N wells 3. The conductivity type of the P well 5 is P. The P well 5 formed in the N well 3 serves as a region where an N channel type MOSFET is formed in a process to be described later. Meanwhile, the P well 5 formed between the N wells 3 serves as a region to isolate the regions RH, RM and RL from each other. Thereafter, the resist pattern 4 is removed, and thereby the silicon substrate 1 is exposed.

Next, as shown in FIG. 2A, a silicon oxide film 6 is formed as a buffer oxide film on the entire surface of the silicon substrate 1. A polysilicon film 7 made of polycrystalline silicon is formed on the silicon oxide film 6 and a silicon nitride film 8 is formed on the polysilicon film 7. Then, a resist pattern 9 is formed on the silicon nitride film 8. The resist pattern 9 serves as a mask to selectively remove the silicon nitride film 8, the polysilicon film 7 and the silicon oxide film 6 by RIE (reactive ion etching). Thus, a three-layered film composed of the silicon oxide film 6, the polysilicon film 7 and the silicon nitride film 8 is patterned to expose the silicon substrate 1 at regions where this three-layered film is removed. Thereafter, the resist pattern 9 is removed.

Next, the silicon substrate 1 is placed in a furnace to perform a thermal oxidation treatment thereon. Then, as shown in FIG. 2B, element isolation films 10 are formed by a LOCOS (local oxidation of silicon) method. Specifically, regions of the top surface of the silicon substrate 1, which are not covered by the three-layered film composed of the silicon oxide film 6, the polysilicon film 7 and the silicon nitride film 8, are selectively oxidized to form the element isolation films 10. Subsequently, the silicon nitride film 8 and the polysilicon film 7 are removed, and thereafter the entire surface of the silicon substrate 1 is etched to remove the silicon oxide film 6.

Next, as shown in FIG. 2C, the thermal oxidation treatment is performed again on the resultant silicon substrate 1 to form silicon oxide films 11, serving as dummy oxide films, on the entire exposed regions of the substrate 1. The thickness of the silicon oxide film 11 is for example 26 nm (nanometer).

Subsequently, as shown in FIG. 3A, a resist pattern 12 is formed on the element isolation films 10 and the silicon oxide films 11. The resist pattern 12 has openings only on regions immediately above the P well 5 formed in the N well 3 of the region RM, that is, regions where a channel, a source, and a drain of an N channel type MOSFET are to be formed. Then, ions of an impurity such as boron are implanted to form the channel of the N type transistor through the silicon oxide film 11, while the resist pattern 12 is used as a mask. Thereby, impurity-implanted regions 13 are formed. Thereafter, the resist pattern 12 is removed.

Next, as shown in FIG. 3B, a resist pattern 14 is formed on the element isolation films 10 and the silicon oxide films 11. The resist pattern 14 has openings only on regions which are in the N well 3 of the region RM, and are immediately above an area outside the P well 5, that is, regions where a channel, a source, and a drain of a P channel type MOSFET are to be formed. Then, ions of an impurity are implanted to form the channel of the P type transistor through the silicon oxide film 11, while the resist pattern 14 is used as a mask. For example, ions of phosphorus (P), arsenic (As) and boron (B) are implanted in this sequence. Incidentally, boron is implanted as the counter. In this manner, impurity-implanted regions 15 are formed. Thereafter, the resist pattern 14 is removed.

Next, as shown in FIG. 3C, a resist pattern 16 is formed, so that the region RH is covered, and that the regions RM and RL are exposed. Then, while the resist pattern 16 is used as a mask, etching is performed to remove the dummy oxide films (silicon oxide films 11) from the regions RM and RL. At this point, in the regions RM and RL, an upper-layer part of the element isolation film 10 is also removed, reducing the thickness of the element isolation film 10. After the completion of the etching, the silicon substrate 1 is exposed in the regions RM and RL. Meanwhile, the dummy oxide films (silicon oxide films 11) with a thickness of, for example, 26 nm remain in the region RH. In this way, formed are the silicon oxide films 11 which cover the region RH, but which do not cover the regions RM and RL. Thereafter, the resist pattern 16 is removed.

Next, the silicon substrate 1 is placed in a furnace to perform a thermal oxidation treatment thereon. This thermal oxidation treatment is performed in a condition such that a thermal oxidation film having a thickness of 14 nm is formed on the exposed regions of the silicon substrate 1, for example. Thereby, as shown in FIG. 4A, silicon oxide films 17 having a thickness of 14 nm are formed in the regions RM and RL where the silicon substrate 1 is exposed. Meanwhile, in the region RH where the silicon oxide films 11 remain, the silicon oxide films 11 having a thickness of, for example, 26 nm are further stacked and oxidized to increase the thickness thereof. Accordingly, a silicon oxide film 18 having a thickness of, for example, 35 nm is formed. As a result, the silicon oxide film 17 serves as a gate insulating film in the region RM. On the other hand, the silicon oxide film 18 serves as a gate insulating film in the region RH.

Next, a resist pattern 19 is formed as shown in FIG. 4B. The resist pattern 19 has openings only on regions immediately above the P well 5 formed in the N well 3 of the region RH, that is, regions where a channel, a source, and a drain of an N channel type MOSFET are to be formed. Then, ions of an impurity are implanted to form the channel of the N type transistor through the silicon oxide film 18, while the resist pattern 19 is used as a mask. Thereby, impurity-implanted regions 20 are formed. Thereafter, the resist pattern 19 is removed.

Next, as shown in FIG. 4C, a resist pattern 21 is formed. The resist pattern 21 has openings only on regions which are in the N well 3 of the region RH, and are immediately above an area outside the P well 5, that is, regions where a channel, a source, and a drain of a P channel type MOSFET are to be formed. Then, ions of an impurity are implanted to form the channel of the P type transistor through the silicon oxide film 18, while the resist pattern 21 is used as a mask. Thereby, impurity-implanted regions 22 are formed. Thereafter, the resist pattern 21 is removed.

Figures 5A, 5B, 5C:
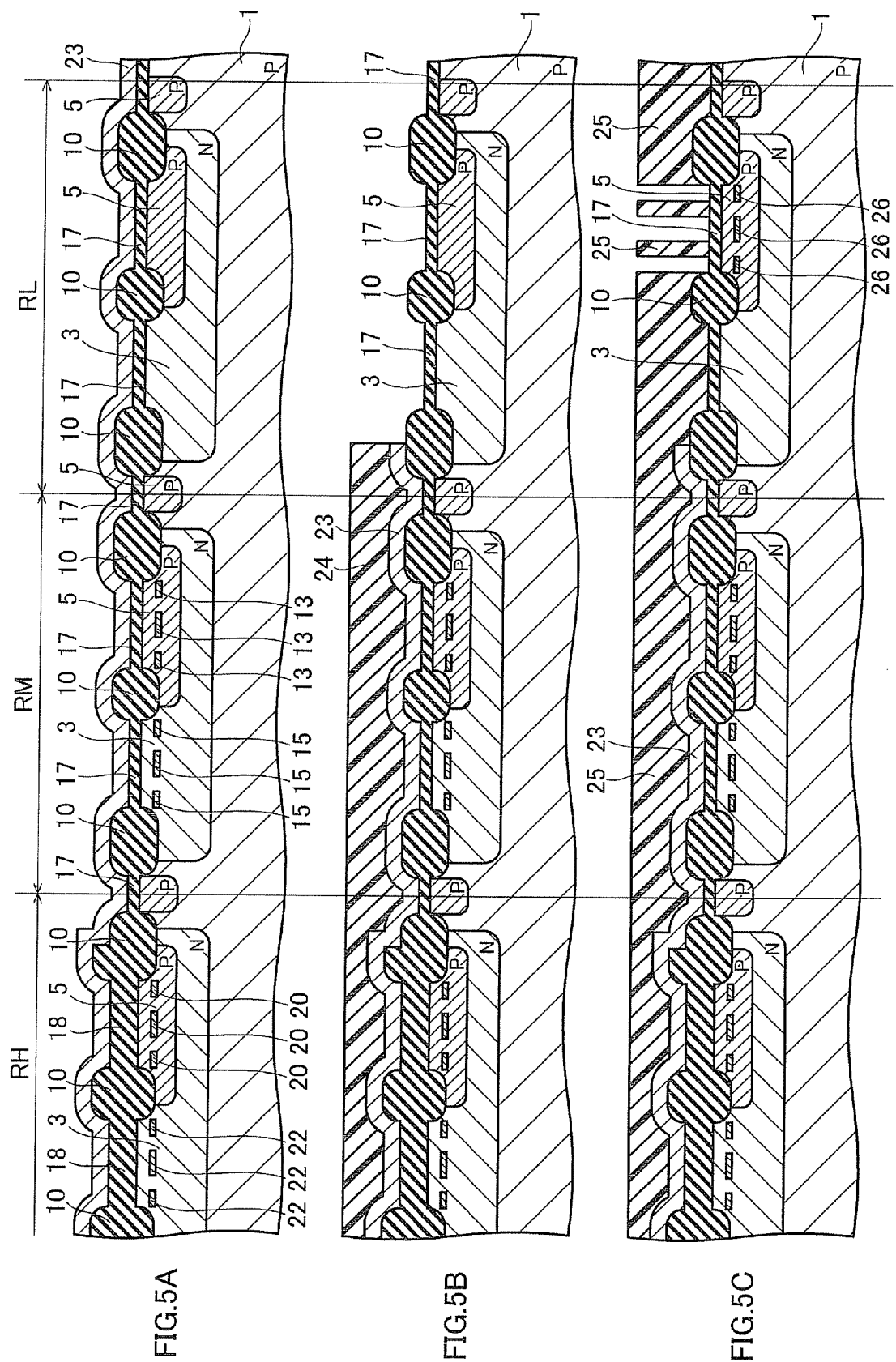
FIGS. 5A to 5C are process cross-sectional views for exemplifying the method of manufacturing a semiconductor device according to this embodiment.

Next, as shown in FIG. 5A, a first layer of a polysilicon film 23 is formed on the entire surface of the silicon substrate 1 by a chemical vapor deposition (CVD) method. The polysilicon film 23 is made of poly-crystalline silicon, and the thickness thereof is for example 150 nm.

Next, as shown in FIG. 5B, a resist pattern 24 is formed on the polysilicon film 23 to cover the regions RH and RM, and to expose the region RL. Then, while the resist pattern 24 is used as a mask, chemical dry etching (CDE) is performed. Thereby, in the region RL, the polysilicon film 23 is removed and the silicon oxide film 17 is exposed. In this manner, formed is the first polysilicon film 23 which covers the regions RH and RM, but not region RL. Thereafter, the resist pattern 24 is removed.

Next, as shown in FIG. 5C, a resist pattern 25 is formed. The resist pattern 25 has openings only on regions immediately above the P well 5 formed in the N well 3 of the region RL, that is, regions where a channel, a source, and a drain of an N channel type MOSFET are to be formed. Then, ions of an impurity are implanted to form the channel of the N type transistor through the silicon oxide film 17, while the resist pattern 25 is used as a mask. Thereby, impurity-implanted regions 26 are formed. Thereafter, the resist pattern 25 is removed.

Next, as shown in FIG. 6A, a resist pattern 27 is formed. The resist pattern 27 has openings only on regions which are in the N well 3 of the region RL, and which are immediately above an area outside the P well 5, that is, regions where a channel, a source, and a drain of a P channel type MOSFET are to be formed. Then, ions of an impurity are implanted to form the channel of the P type transistor through the silicon oxide film 17, while the resist pattern 27 is used as a mask. Thereby, impurity-implanted regions 28 are formed. Thereafter, the resist pattern 27 is removed.

Next, as shown in FIG. 6B, while the polysilicon film 23 is used as a mask, etching is performed to remove the silicon oxide films 17 formed in the region RL and to expose the silicon substrate 1. At this point, in the region RL, upper-layer parts of the element isolation films 10 are also removed.

Next, the silicon substrate 1 is placed in a furnace to perform a thermal oxidation treatment thereon. Thereby, as shown in FIG. 6C, in the region RL, silicon oxide films 29 having a thickness smaller than that of the silicon oxide films 17 are formed on the top surface of the silicon substrate 1. The thickness of the silicon oxide film 29 is for example 9 nm. The silicon oxide film 29 serves as a gate insulating film in the region RL. Moreover, at this point, the top and edge surfaces of the polysilicon film 23 are oxidized to form an oxide film 30 in the regions RH and RM.

Next, as shown in FIG. 7A, a second layer of a polysilicon film 31 is formed on the entire surface of the silicon substrate 1 by the CVD method. The polysilicon film 31 is made of poly-crystalline silicon, and the thickness thereof is for example 150 nm.

Next, as shown in FIG. 7B, a resist pattern 32 is formed to cover the region RL, and to expose the regions RM and RH. Then, while the resist pattern 32 is used as a mask, CDE is performed to remove the polysilicon film 31 from the regions RM and RH. Subsequently, while the resist pattern 32 is used as a mask, wet etching is performed to remove the oxide film 30. Thereafter, the resist pattern 32 is removed. In this manner, the polysilicon film 31 is formed on the silicon oxide film 29. As a result, the second polysilicon film 31 remains in the region RL, while the first polysilicon film 23 remains in the regions RM and RH. At this time, there may be a clearance formed between the first polysilicon film 23 and the second polysilicon film 31.

Next, as shown in FIG. 7C, a third layer of a polysilicon film 33 is formed on the entire surface of the silicon substrate 1 by the CVD method. The polysilicon film 33 is deposited to cover the polysilicon films 23 and 31 as well as the clearance therebetween. Thereby, a stacked polysilicon film 34 composed of the polysilicon films 23, 31 and 33 is formed. The thickness of the polysilicon film 33 is for example 250 nm. Accordingly, the thickness of the stacked polysilicon film 34 is for example 400 nm (=150 nm+250 nm).

Subsequently, phosphorus is introduced into the entire of stacked polysilicon film 34, thereby improving the conductivity of the stacked polysilicon film 34. The introduction of phosphorus can be exemplified by the following method. Specifically, an oxygen gas ($O_2$ gas) and a nitrogen gas ($N_2$ gas) which is passed through liquid $POCl_3$ (phosphorus oxychloride) are brought into contact with the stacked polysilicon film 34 to form a phosphorus-oxide layer (unillustrated) on the surface of the stacked polysilicon film 34. This phosphorus-oxide layer serves as the source of diffusion to introduce phosphorus into the stacked polysilicon film 34.

Figure 8A:
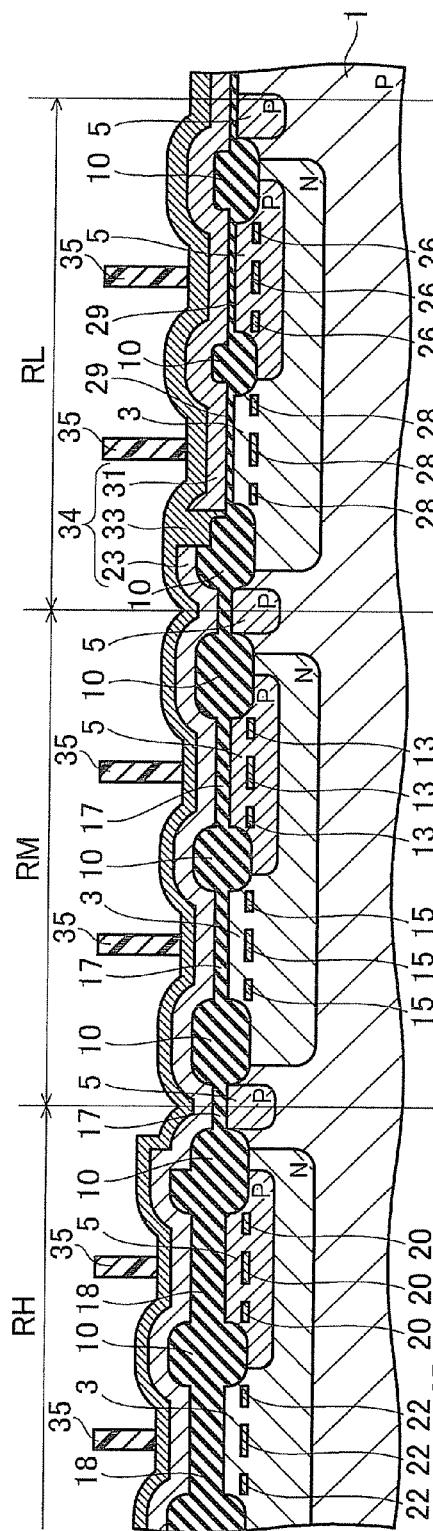
FIGS. 8A to 8C are process cross-sectional views for exemplifying the method of manufacturing a semiconductor device according to this embodiment.

Next, as shown in FIG. 8A, a resist pattern 35 is formed on the stacked polysilicon film 34. The resist pattern 35 is patterned to cover areas where gates of the MOSFETs in each region are to be formed, and to expose the other areas of the stacked polysilicon film 34.

Figure 8B:
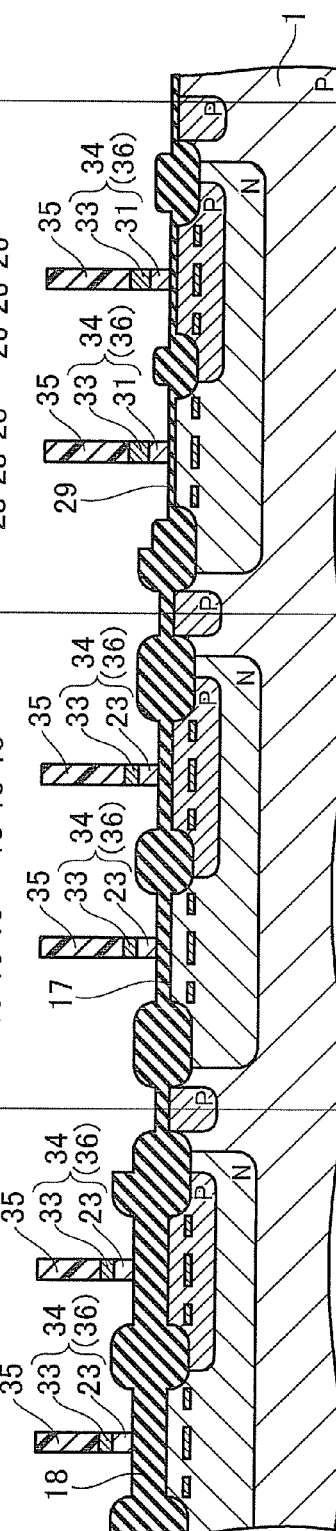

Next, as shown in FIG. 8B, while the resist pattern 35 is used as a mask, RIE is performed, so that the stacked polysilicon film 34 is selectively removed and patterned. Thereby, gate electrodes 36 made of the stacked polysilicon film 34 are formed in each region. Thereafter, the resist pattern 35 is removed.

Figure 8C:
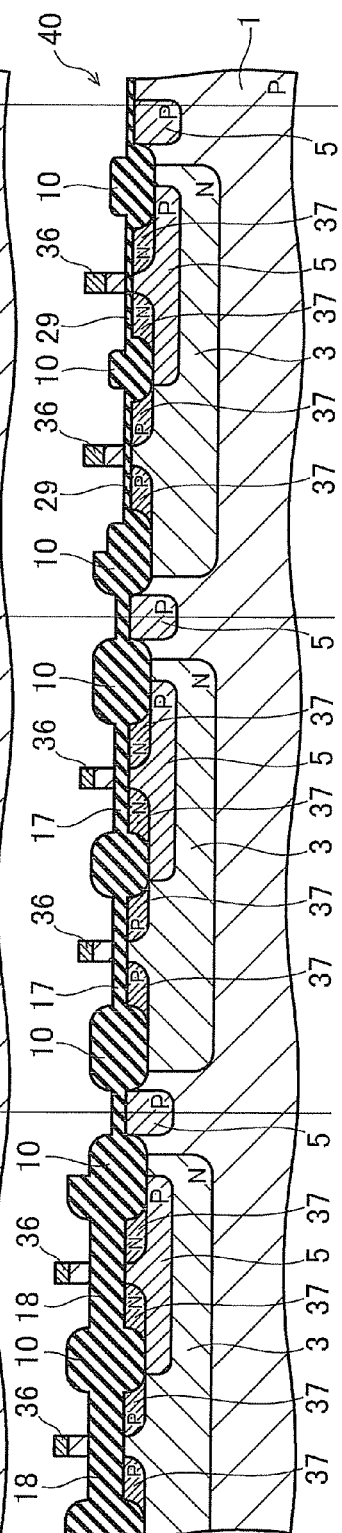

Next, ions of an impurity are implanted into the MOSFETs of each conductivity type in each region, while a resist pattern (unillustrated) and the gate electrodes 36 serve as masks. At this point, for example, the ion implantation condition, i.e., ionic species, accelerating voltage, or the like, may be altered in each region. Then, the impurity is diffused in each region, to form source and drain regions 37 as shown in FIG. 8C. Thereafter, an interlayer insulating film (unillustrated) is formed to bury the gate electrodes 36 on the silicon substrate 1, and a wiring and the like (unillustrated) are formed. Thereby, a semiconductor device 40 is fabricated.

As shown in FIG. 8C, in the semiconductor device 40 according to this embodiment, the N channel type MOSFET and the P channel type MOSFET are formed in each of the regions RH, RM and RL. The thicknesses of the gate insulating films vary among these regions. Specifically, the transistor formed in the region RH is the intermediate-breakdown voltage transistor with a gate voltage in a range of, for example, approximately 5 V to 18 V, and uses the silicon oxide film 18 with a thickness of, for example, 35 nm as the gate insulating film. Moreover, the transistor formed in the region RM is the transistor with a gate voltage of, for example, approximately 5 V, and uses the silicon oxide film 17 with a thickness of, for example, 14 nm as the gate insulating film. Furthermore, the transistor formed in the region RL is the transistor with a gate voltage of, for example, approximately 3 V, and uses the silicon oxide film 31 with a thickness of, for example, 9 nm as the gate insulating film. In this manner, the gate insulating films with the three levels of thicknesses are formed in the semiconductor device 40.

In one example, the transistors formed in the regions RH and RM constitute a constant-voltage regulator which outputs a constant voltage of 2.9 V with a power source of 5 V. The transistor formed in the region RL constitutes a level shifter which converts a constant voltage of 2.9 V into 1.8 V. Besides the above, the semiconductor device 40 may have an electrostatic protection circuit such as a Sarnoff circuit fabricated therein.

Hereinafter, effects of the present embodiment will be described.

As described above, this embodiment allows the fabrication of the gate insulating films with three levels of thicknesses on one chip, and thereby it is possible to fabricate transistors having three kinds of threshold voltages in the semiconductor device. This makes it possible to consolidate, on one chip, circuits such as an analogue circuit and a digital circuit having different functions from each other. Thus, significant reduction in a die size is achieved. As a result, the reduction in package size can be achieved.

Moreover, according to this embodiment, the resist pattern 16 is used as the mask for etching the dummy oxide films (silicon oxide films 11) in the regions RM and RL in the step shown in FIG. 3C. The polysilicon film 23 is used as the mask for etching the silicon oxide film 17 in the region RL in the step shown in FIG. 6B. Accordingly, it is not necessary to use a silicon nitride film as the mask for etching the silicon oxide films. The polysilicon film has a higher selective etching ratio to a silicon oxide film than that of the silicon nitride film. Thus, it is possible to accurately etch the silicon oxide film, and thereby to precisely control the shape of a gate insulating film.

Furthermore, according to this embodiment, it is not necessary to form a silicon nitride film which is used as the mask and then removed. Thereby, the number of manufacturing steps is reduced. In this embodiment, the polysilicon film 23 served as the mask is used as a part of the gate electrode 3, also, so that the step of removing the polysilicon film 23 can be not required.

Still furthermore, according to this embodiment, the polysilicon film 23 is selectively etched and removed from the region RL in the step shown in FIG. 5B. In this etching, it is possible to acquire a large selective etching ratio between the polysilicon film 23 and the silicon oxide film 17 formed beneath the polysilicon film 23. By this etching, the silicon oxide film 17 would not be lost or damaged, and this unmodified silicon oxide film 17 can be used as the sacrificial oxide film in the ion implantation steps shown in FIGS. 5C and 6A. Accordingly, it is possible to accurately implant impurities for forming a channel in the region RL without removing the silicon oxide film 17 in the region RL and thereon forming a sacrificial oxide film in an addition step. Thereby, the manufacturing procedure is simplified.

Still furthermore, according to this embodiment, the first polysilicon film 23 is formed in the step shown in FIG. 5A, and then patterned in the step shown in FIG. 5B so that the polysilicon film 23 is removed from the region RL. After that, the second polysilicon film 31 is formed in the step shown in FIG. 7A, and patterned in the step shown in FIG. 7B so that the second polysilicon film 31 remains only in the region RL. Then, the third polysilicon film 33 is formed on the entire substrate surface in the step shown in FIG. 7C. Thus, the stacked polysilicon film 34 has the two-layer configuration in each region. Accordingly, it is not required to form a thick polysilicon film in an additional step, and the coverage with a polysilicon film is improved. Moreover, even when, for example, a clearance occurs between the polysilicon film 23 and the polysilicon film 31 in the step shown in FIG. 7B, the clearance can be buried with the third polysilicon film which is formed on the entire substrate surface, thereby preferably improving the flatness of the entire semiconductor device 40. Consequently, the gate electrodes 36 are uniformly formed across the entire region of the semiconductor device 40.

Still furthermore, in this embodiment, as shown in FIGS. 3A to 8B, the impurity-implanted regions 20, 13 and 26 (into which the ions of an impurity are implanted to form the channels of the N type transistors) as well as the impurity-implanted regions 22, 15 and 28 (into which the ions of an impurity are implanted to form the channels of the P type transistors) are selectively formed in regions between the adjacent element isolations in each of the regions RH, RM and RL. However, the same effects of the present invention can be obtained, even when the impurity-implanted regions are formed continuously across the regions between the adjacent element isolations. For example, although not shown, the three impurity implanted regions 20 in FIG. 8B may form a single impurity region including the three impurity implanted regions 20 as well as the area in the P well 5 between the two outer and the one inner impurity regions 20. Moreover, each impurity-implanted region of the N type and P type has a function to control the impurity concentrations of the areas where the channels of the N well 3 and the P well 5 are formed, and thereby the impurity-implanted regions have a function to adjust the threshold voltages of the N type and P type transistors formed thereover.

In this manner, according to this embodiment, it is possible to manufacture a semiconductor device with a less number of manufacturing steps as well as to control the shape of gate insulating films with high accuracy.

The present invention has been described so far while the embodiment is being referred to. However, the present invention is not limited to this embodiment. For example, even if those skilled in the art add, delete, and alter conditions in the steps of the above-described embodiment, these changes are within the scope of the present invention, as long as the spirit of the present invention is included in these changes. For instance, in the above-described embodiment, a depression type transistor may be formed in any region, or a capacitor may be formed in each region. In the latter case, it is possible to fabricate the capacitor according to the same steps as those described for the MOSFET, if: an insulating film of the capacitor is the gate insulating film; one electrode of the capacitor is, for example, the N well 3; and the other electrode is the stacked polysilicon film 34. Moreover, in this case, it is possible to fabricate the capacitors having three levels of capacitances, since the thicknesses of the insulating films of the capacitors can be set into three levels. Furthermore, in the above embodiment, described has been the case where the polysilicon film is used as the mask for etching the silicon oxide film or the oxide film; however, the present invention is not limited to this case. For example, a silicon film such as a single-crystal silicon film or amorphous silicon may also be used in place of the polysilicon film. Even in such a case, the selective etching ratio to the silicon oxide film can be increased, and thereby the same effects as those in the above-described embodiment are obtained.

The invention claimed is:

1. A method of manufacturing a semiconductor device comprising the steps of:
   implanting an impurity into a second region to form a channel of a transistor;
   forming a first silicon oxide film which covers a first region on the top surface of a silicon substrate, but which does not cover the second region and a third region thereon;
   oxidizing the silicon substrate to thicken the first silicon oxide film formed on the first region, and to form a second silicon oxide film on the second region and the third region;
   forming a first silicon film which covers the first region and the second region, but which does not cover the third region;
   etching and removing the second silicon oxide film formed on the third region by using the first silicon film as a mask; and
   forming a third silicon oxide film on the third region, the third silicon oxide film being thinner than the second silicon oxide film.

2. The method of manufacturing a semiconductor device according to claim 1, further comprising the steps of:

forming a second silicon film on the third silicon oxide film in a way that the second silicon film covers the third region, but does not cover the first and second regions; and etching and removing the third silicon oxide film in accordance with a shape of the second silicon film.

3. The method of manufacturing a semiconductor device according to claim 2, wherein the first and second silicon films are made of polysilicon.

4. The method of manufacturing a semiconductor device according to claim 2, further comprising a step of:

patterning the first and second silicon films to form gate electrodes.

5. The method of manufacturing a semiconductor device according to claim 2, further comprising a step of:

forming a third silicon film which entirely covers the top surfaces of the silicon substrate, including the top surfaces of the first and second silicon films.

6. The method of manufacturing a semiconductor device according to claim 5, further comprising a step of:

patterning the first and second silicon films together with the third silicon film to form gate electrodes.

7. The method of manufacturing a semiconductor device according to claim 1, further comprising, between the step of forming the second silicon oxide film and the step of forming the first silicon film, a step of:

implanting an impurity into the first region to form a channel of a transistor.

8. The method of manufacturing a semiconductor device according to claim 1, further comprising, between the step of forming the first silicon film and the step of removing the second silicon oxide film, a step of:

implanting an impurity into the third region to form a channel of a transistor.

9. The method of manufacturing a semiconductor device according to claim 1, further comprising, before the step of forming the first silicon oxide film, a step of:

selectively forming wells of a first conductivity type in the first, second, and third regions, respectively.

10. The method of manufacturing a semiconductor device according to claim 9, further comprising, before the step of forming the first silicon oxide film, a step of:

forming a well of a second conductivity type in each of the wells of the first conductivity type.

11. The method of manufacturing a semiconductor device according to claim 10, further comprising, before the step of forming the first silicon oxide film, a step of:

forming an element isolation film.

12. A method of manufacturing a semiconductor device comprising the steps of:

forming a first silicon oxide film which covers a first region on the top surface of a silicon substrate, but which does not cover a second region and a third region thereon;

implanting an impurity into the first region to form a channel of a transistor;

oxidizing the silicon substrate to thicken the first silicon oxide film formed on the first region, and to form a second silicon oxide film on the second region and the third region;

forming a first silicon film which covers the first region and the second region, but which does not cover the third region;

etching and removing the second silicon oxide film formed on the third region by using the first silicon film as a mask; and forming a third silicon oxide film on the third region, the third silicon oxide film being thinner than the second silicon oxide film.

13. A method of manufacturing a semiconductor device comprising the steps of:

forming a first silicon oxide film which covers a first region on the top surface of a silicon substrate, but which does not cover a second region and a third region thereon;

oxidizing the silicon substrate to thicken the first silicon oxide film formed on the first region, and to form a second silicon oxide film on the second region and the third region;

implanting an impurity into the third region to form a channel of a transistor;

forming a first silicon film which covers the first region and the second region, but which does not cover the third region;

etching and removing the second silicon oxide film formed on the third region by using the first silicon film as a mask; and forming a third silicon oxide film on the third region, the third silicon oxide film being thinner than the second silicon oxide film.

* * * * *